(12) United States Patent
Santangelo et al.

(10) Patent No.: US 12,166,141 B2
(45) Date of Patent: Dec. 10, 2024

(54) MANUFACTURING PROCESS FOR A SILICON CARBIDE ULTRAVIOLET LIGHT PHOTODETECTOR

(71) Applicant: STMICROELECTRONICS S.R.L., Agrate Brianza (IT)

(72) Inventors: Antonello Santangelo, Belpasso (IT); Massimo Cataldo Mazzillo, Corato (IT); Salvatore Cascino, Gravina di Catania (IT); Giuseppe Longo, Catania (IT); Antonella Sciuto, S.Giovanni la Punta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 17/719,205

(22) Filed: Apr. 12, 2022

(65) Prior Publication Data

US 2022/0238738 A1 Jul. 28, 2022

Related U.S. Application Data

(62) Division of application No. 16/370,636, filed on Mar. 29, 2019, now Pat. No. 11,335,823.

(30) Foreign Application Priority Data

Mar. 30, 2018 (IT) .................. 102018000004149

(51) Int. Cl.
*H01L 31/0352* (2006.01)
*H01L 21/74* (2006.01)
(Continued)

(52) U.S. Cl.
CPC ...... *H01L 31/035281* (2013.01); *H01L 21/74* (2013.01); *H01L 29/0623* (2013.01);
(Continued)

(58) Field of Classification Search
CPC ... H01L 21/74; H01L 27/1446; H01L 27/146; H01L 29/0623; H01L 31/02161;
(Continued)

(56) References Cited

U.S. PATENT DOCUMENTS 4,586,067 A 4/1986 Webb
7,863,647 B1 1/2011 Veliadis
(Continued)

FOREIGN PATENT DOCUMENTS

CN 104882509 A 9/2015
CN 104882510 A 9/2015
(Continued)

OTHER PUBLICATIONS

"C7027A, C7035, C7044A Minipeeper Ultraviolet Flame Detectors," *Honeywell Inc.*, Rev. 11-92, Form No. 60-2026-8, 10 pages, 1992.
(Continued)

*Primary Examiner* — Herve-Louis Y Assouman
*Assistant Examiner* — Christopher M Roland
(74) *Attorney, Agent, or Firm* — SEED IP LAW GROUP LLP

(57) ABSTRACT

The photodetector is formed in a silicon carbide body formed by a first epitaxial layer of an N type and a second epitaxial layer of a P type. The first and second epitaxial layers are arranged on each other and form a body surface including a projecting portion, a sloped lateral portion, and an edge portion. An insulating edge region extends over the sloped lateral portion and the edge portion. An anode region is formed by the second epitaxial layer and is delimited by the projecting portion and by the sloped lateral portion. The first epitaxial layer forms a cathode region underneath the anode region. A buried region of an N type, with a higher doping level than the first epitaxial layer, extends between
(Continued)

the anode and cathode regions, underneath the projecting portion, at a distance from the sloped lateral portion as well as from the edge region.

14 Claims, 7 Drawing Sheets

(51) Int. Cl.
H01L 29/06 (2006.01)
H01L 31/0216 (2014.01)
H01L 31/028 (2006.01)
H01L 31/0312 (2006.01)
H01L 31/107 (2006.01)
H01L 31/18 (2006.01)
H01L 27/144 (2006.01)
H01L 27/146 (2006.01)

(52) U.S. Cl.
CPC ...... H01L 31/02161 (2013.01); H01L 31/028 (2013.01); H01L 31/0312 (2013.01); H01L 31/0352 (2013.01); H01L 31/03529 (2013.01); H01L 31/107 (2013.01); H01L 31/1804 (2013.01); *H01L 27/1446* (2013.01); *H01L 27/146* (2013.01)

(58) Field of Classification Search
CPC ............... H01L 31/028; H01L 31/0312; H01L 31/0352; H01L 31/035281; H01L 31/03529; H01L 31/107; H01L 31/1804
See application file for complete search history.

(56) References Cited

U.S. PATENT DOCUMENTS

| 2003/0162355 A1* | 8/2003 | Sankin ................. H01L 29/868 257/E29.183 |
| 2004/0108530 A1 | 6/2004 | Sandvik et al. |
| 2007/0018268 A1 | 1/2007 | Einbrodt et al. |
| 2009/0184317 A1 | 7/2009 | Sanfilippo et al. |
| 2010/0271108 A1 | 10/2010 | Sanfilippo et al. |
| 2011/0024768 A1 | 2/2011 | Veliadis |
| 2013/0099091 A1 | 4/2013 | Nemirovsky et al. |
| 2017/0098730 A1 | 4/2017 | Mazzillo et al. |
| 2017/0353673 A1 | 12/2017 | Roy |
| 2017/0365636 A1 | 12/2017 | Mazzillo et al. |
| 2019/0035883 A1* | 1/2019 | Takeuchi .......... H01L 21/02639 |
| 2019/0319158 A1* | 10/2019 | Mazzillo ............. H01L 27/1446 |
| 2019/0319159 A1* | 10/2019 | Mazzillo ......... H01L 31/022408 |

FOREIGN PATENT DOCUMENTS

DE 3921028 A1 1/1991
JP 09148618 A * 6/1997

OTHER PUBLICATIONS

Vert, Alexey et al., "Solar-Blind 4H-SiC Single-Photon Avalanche Diode Operating in Geiger Mode," *IEEE Photonics Technology Letters*, 20(18):1587-1589, Sep. 15, 2008.
Zhou, Dong et al., "High-Temperature Single Photon Detection Performance of 4H—SiC Avalanche Photodiodes," *IEEE Photonics Technology Letters*, 26(11):1136-1138, Jun. 1, 2014.
Wang et al., "A Study of Silicon Carbide Ultraviolet Detectors," *Journal of University of Science and Technology of China*, 33(6):683-687, Dec. 2003.

* cited by examiner

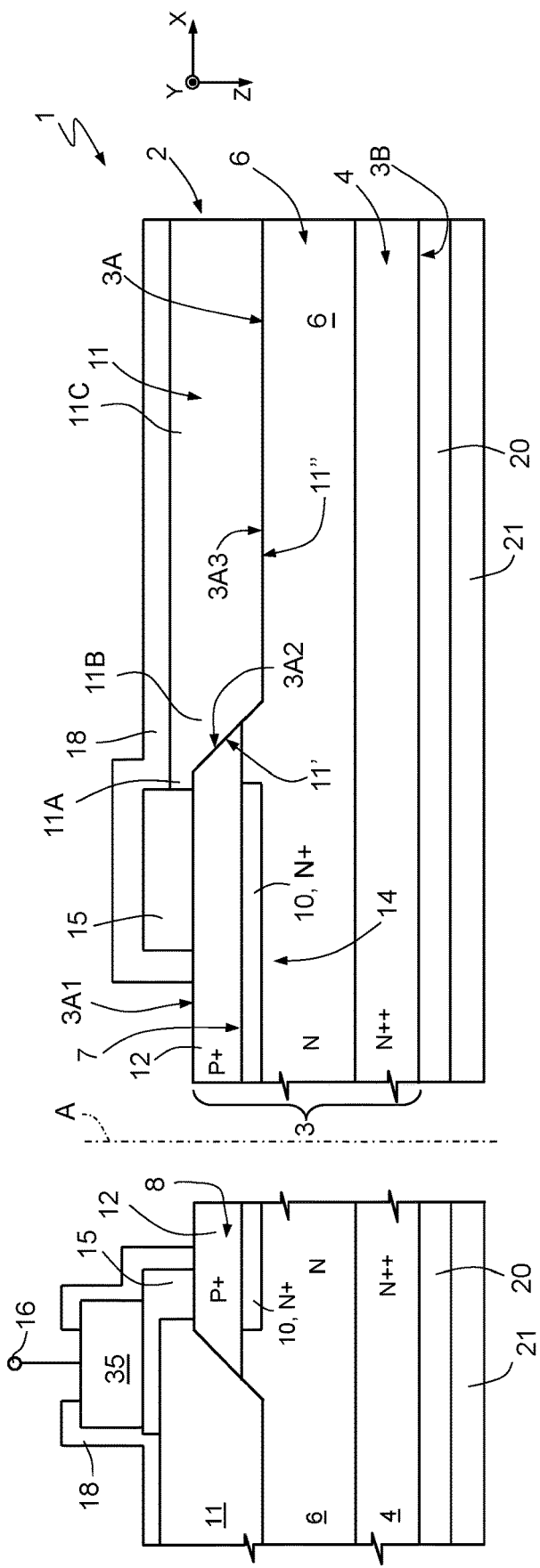
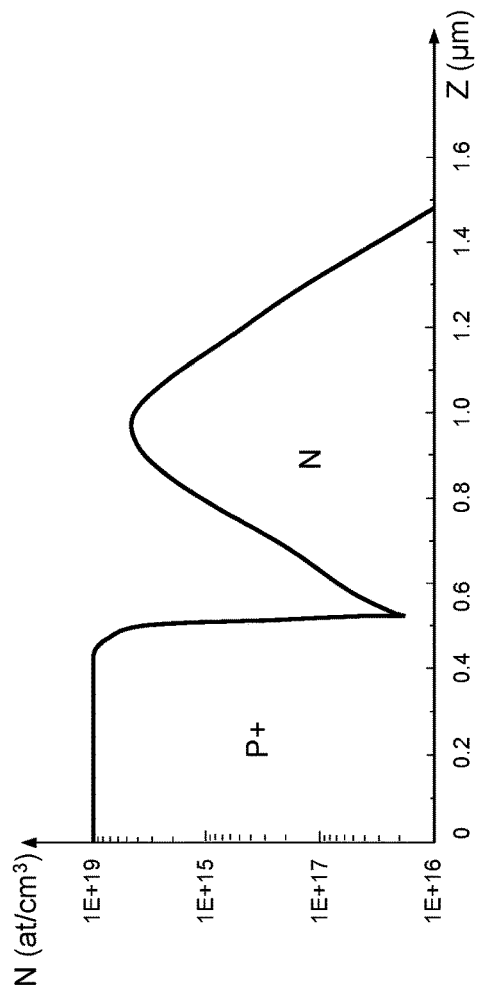
Fig.1
Fig.1A

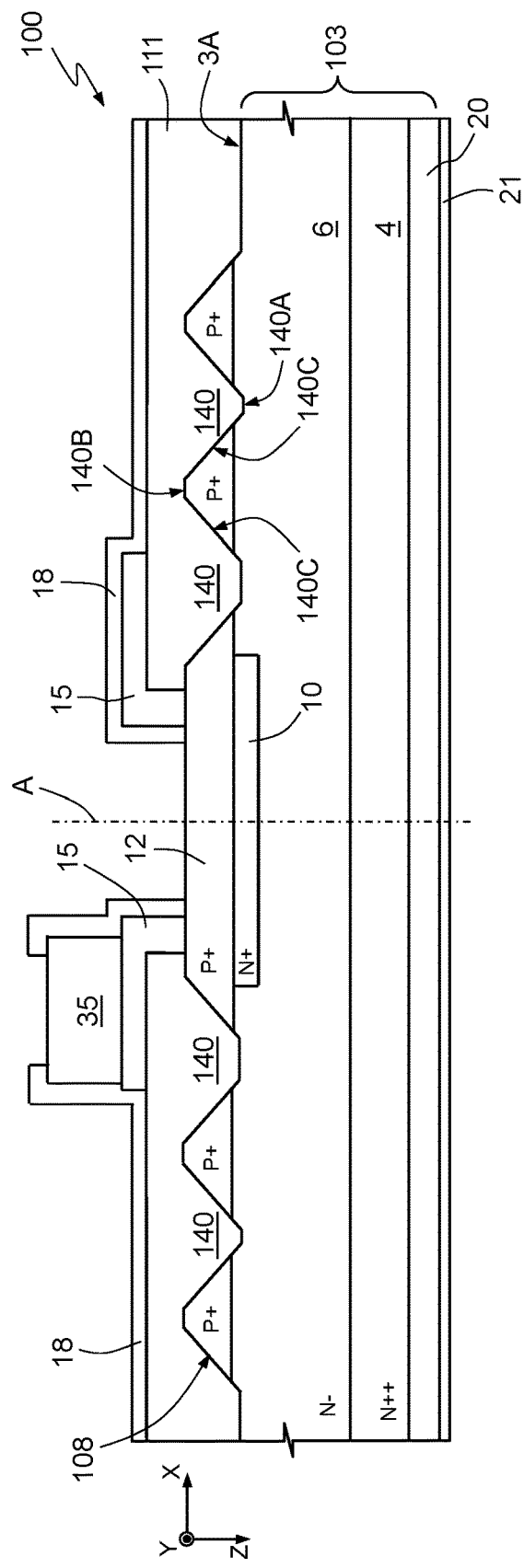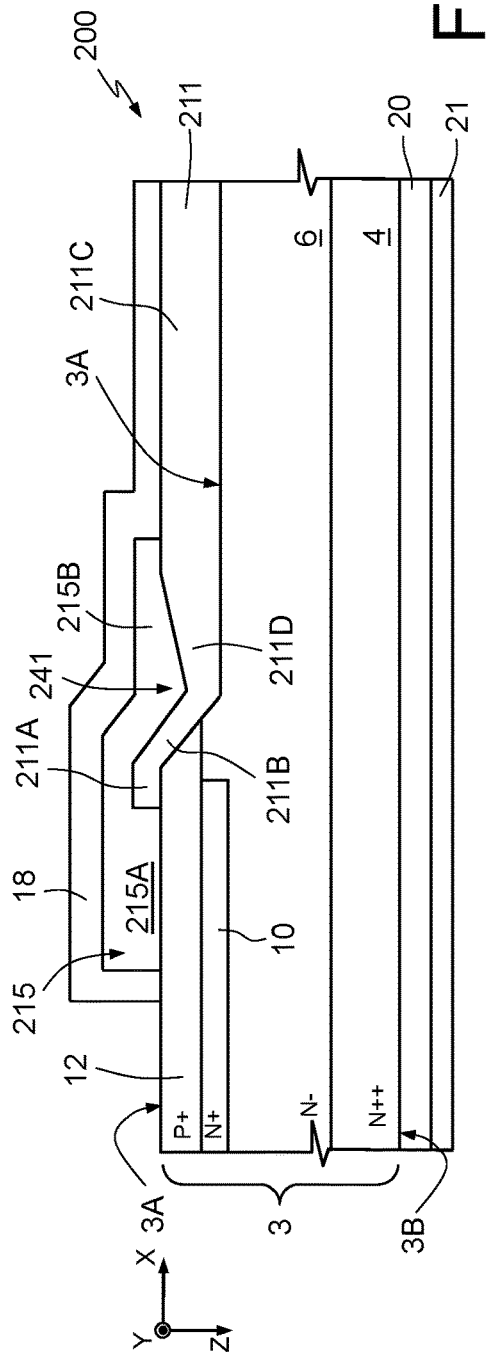

MANUFACTURING PROCESS FOR A SILICON CARBIDE ULTRAVIOLET LIGHT PHOTODETECTOR

BACKGROUND

Technical Field

The present disclosure relates to a silicon carbide ultraviolet light photodetector and to the manufacturing process thereof.

Description of the Related Art

As is known, in the field of photon detection, the need is felt to have devices enabling detection of ultraviolet (UV) light with a high sensitivity in the spectral region of 100-400 nm. In particular, detection of very weak and ultra-fast signals outside the range of solar light is desired for various applications, such as flame detection, UV astronomy, execution of chemical and biological analyses, and detection of jet engines and missiles plumes. These applications require devices that are very sensitive and have a high signal-to-noise ratio.

For such applications, photomultiplier tubes (PMTs) are normally used, but their large size, their brittleness, and the associated costs render solid-state detectors more attractive.

Amongst them, commercially available silicon avalanche photodiodes have a moderate quantum efficiency at the non-visible wavelengths but require costly optical filters to obtain a high rejection ratio of solar photons, since their response extends throughout the visible wavelength range.

Gallium-nitride based diode photodetectors have demonstrated a high sensitivity in the region of non-visible light and a good gain, but suffer from the problem of having a high dark current due to the high defect density in this type of semiconductor.

Silicon carbide based avalanche diodes have a lower dark-current density, thanks to their low thermal generation, and thus represent an advantageous choice for UV-light photodetectors, also considering the more mature process technology and an excellent intrinsic opacity to visible light.

US patent application US20170098730, corresponding to Italian patent application 102015000058764, describes a silicon carbide avalanche photodiode for detecting ultraviolet radiation having a completely planar structure. This avalanche photodiode has an active area and an edge ring obtained by implanting aluminum at different doses and energies. This structure enables minimization of the dead area around the active area, reduction of the breakdown voltage, and improvement of the detection efficiency over the entire UV range. A considerable gain is thus obtained (of the order of $10^2$ to $10^5$) measured in the avalanche multiplication condition.

However, this solution may be improved as regards dark current, in particular in some frequencies, presumably due to surface implantation processes and soft breakdown (i.e., not sufficiently rapid breakdown) caused by a considerable injection of leakage current starting from the device periphery prior to breakdown and triggering the desired avalanche process. In practice, it is assumed that the confinement of the electrical field in the active area of the photodetector is not always high, and the electrical field extends also laterally, thus causing breakdown over an extensive area.

The above effects negatively affect the operation of the device in the single photon condition under illumination—so called single photon avalanche diode (SPAD) or Geiger mode-avalanche photodiode (GM-APD) operating condition. Similar considerations apply to operation as avalanche photodiodes (APDs), since the latter operate in a way similar to SPADs, except for having a linear operating range below the breakdown voltage and more limited gain.

BRIEF SUMMARY

One or more embodiments of the present disclosure provide a silicon carbide ultraviolet light photodetector that overcomes the drawbacks of the prior art.

According to the present disclosure, a silicon carbide ultraviolet light photodetector and the manufacturing process thereof are provided.

BRIEF DESCRIPTION OF THE SEVERAL VIEWS OF THE DRAWINGS

For a better understanding, some embodiments of the present photodetector are now described, purely as non-limiting example, with reference to the attached drawings, wherein:

FIG. 1 is a cross-section of an embodiment of the present photodetector;

FIG. 1A shows the doping profile of the photodetector of FIG. 1, taken along central axis A, parallel to Cartesian axis Z;

FIGS. 9-11 are cross-sections of other embodiments of the present photodetector;

DETAILED DESCRIPTION

FIG. 1 shows an embodiment of a photodetector 1 of a silicon carbide APD type, but the photodetector 1 may operate also in SPAD operating condition.

The photodetector 1 of FIG. 1 has a central axis A. In particular, the photodetector 1 may have circular symmetry so that the central axis A is an axis of symmetry. Alternatively, the photodetector 1 may have a polygonal shape, for example square, in top plan view.

Figure 18:
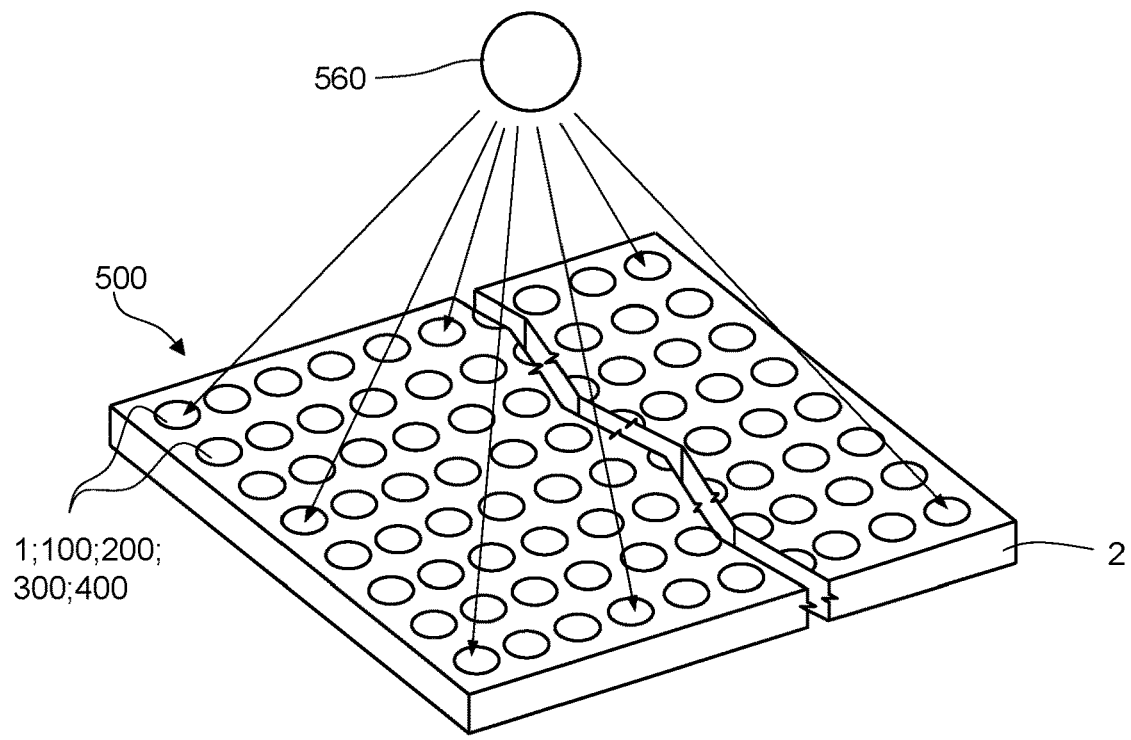
FIG. 18 is a schematic perspective views of an array of photodetectors of the type illustrated in FIGS. 1, 9-11, and 15.

The photodetector 1 may be integrated in a die 2, together with a plurality of other photodetectors 1 to form an array 500, such as the one illustrated in FIG. 18.

The die 2 comprises a silicon carbide (SiC) body 3, formed by a substrate 4, of an $N^{++}$ type, a first epitaxial layer 6, of an $N^-$ type, and a second epitaxial layer 8, of a $P^+$ type, stacked on top of each other. The body 3 has a non-planar top surface 3A, defined by portions of the first and second epitaxial layers 6, 8, and a planar bottom surface 3B. In particular, the top surface 3A has a projecting portion 3A1, for example of a planar circular shape; a sloped lateral portion 3A2, for example having a frustoconical shape; and an edge portion 3A3, here planar, as clarified hereinafter.

Moreover, the second surface 3B is parallel to a plane XY of a Cartesian reference system XYZ, wherein the thickness of the body 3 is measured along the axis Z (hereinafter also referred to as thickness direction). In FIG. 1, the first and second epitaxial layers 6, 8 form an interface 7, which is planar and parallel to the plane XY. The substrate 4 and the first epitaxial layer 6 are doped, for example, with nitrogen, and the second epitaxial layer 8 is doped, for example, with boron. A buried region 10, of an $N^+$ type and doped, for example, with phosphorus, extends within the first epitaxial layer 6, here adjacent and contiguous to the second epitaxial layer, for a part of the interface 7. The buried region 10 has a variable doping in the thickness direction (parallel to axis Z) with a concentration of dopant species increasing from the interface 7 up to a peak value and then again decreasing down to the doping level of the first epitaxial layer 4, as illustrated in FIG. 1A. For instance, at the peak, the buried region 10 has a doping level of $5·10^{18}$ $cm^{-3}$.

An edge region 11, of insulating material, extends over part of the top surface 3A and delimits laterally, in the second epitaxial layer 8, an anode region 12. The edge region 11, for example of tetraethylorthosilicate (TEOS), comprises an inner annular portion 11A, extending over the peripheral area of the anode region 12 (the central area whereof is thus exposed to the external environment); a sloped annular portion 11B, as a continuation of the inner annular portion 11A, laterally surrounding and contiguous to the anode region 12; and an outer portion 11C, as a continuation of the sloped annular portion 11B, on top of and contiguous to an edge area of the first epitaxial layer 6.

The inner annular portion 11A of the edge region 11 may be missing. The sloped annular portion 11B of the edge region 11 has a thickness increasing from the inner annular portion 11A up to the outer portion 11C, surrounds at a distance the buried region 10, and forms a sloped peripheral surface 11' of the edge region 11 (corresponding to the sloped lateral portion 3A2 of the top surface 3A of the body 3). In particular, the distance between the lateral edge of the buried region 10 and the sloped peripheral surface 11' is at least 0.5-1 μm. The outer region 11C of the edge region 11 has a uniform thickness (between 1 and 3 μm, for example 2 μm) and has a bottom surface 11" (corresponding to the edge portion 3A3 of the top surface 3A of the body 3) that is contiguous to the first epitaxial layer 6 and extends at a lower level than the interface 7 (in the thickness direction Z).

The sloped lateral portion 3A2 of the top surface 3A of the body 3 and thus the peripheral surface 11' of the edge region 11 are inclined by an angle of at least 45°, up to a maximum of 90°, with respect to the plane of the interface 7 for the reasons clarified below.

The edge region 11 delimits, in the body 3, an active area 14, in the central area whereof the aforementioned breakdown during detection is to be obtained.

A top conductive region 15, for example of nickel silicide ($Ni_2Si$), is arranged on, and in direct contact with, the anode region 12, to form a front ohmic contact. A front contact region 35, represented by an electrode 16, extends on a portion of the top conductive region 15, for external connection. The top conductive region 15 has, for example, an annular shape and overlies a peripheral portion of the anode region 12.

A passivation layer 18, for example of silicon nitride ($Si_3N_4$), extends over the edge region 11 and surrounds the top conductive region 15 at the top and laterally, except in the front contact region 35.

A bottom conductive region 20, for example of nickel silicide, extends underneath the bottom surface 3B of the body 3, in contact with the substrate 4, and forms a rear ohmic contact. A bottom metallization 21 is arranged underneath the bottom conductive region 20, in contact with the latter. The bottom metallization 21 may be formed by a multilayer structure including three stacked layers of titanium, nickel, and gold.

In practice, the first epitaxial layer 6 has an electrical behavior equivalent to that of an intrinsic layer. The anode region 12, the buried region 10, and the first epitaxial layer 6 thus form a $PN^+NI$ junction; the first epitaxial layer 6 thus operates as cathode region. The photodetector 1 can consequently work as APD or SPAD, where the $PN^+NI$ junction is designed to receive photons and generate the avalanche current, as described in U.S. patent application US20170098730, which is incorporated by reference herein in its entirety.

The photodetector 1 of FIG. 1 may be manufactured as illustrated in FIGS. 2-9 and described in detail hereinafter.

Figure 2:
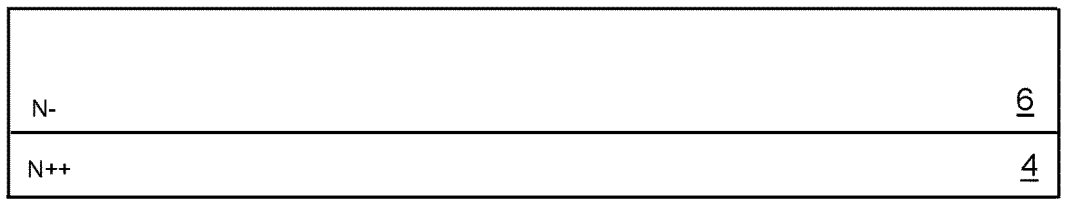
FIGS. 2-8 are schematic cross-sections of the photodetector of FIG. 1 during successive manufacturing steps.

Initially, FIG. 2, the first epitaxial layer 6 is epitaxially grown on the substrate 4, for example of 4H-polytype silicon carbide (4H—SiC) of an N type with a thickness, for example, of 350 μm, and a doping level, for example, of $1·10^{19}$ $cm^{-3}$. The first epitaxial layer 4 has a thickness of 8-12 μm, for example, approximately 9.5 μm, and a doping level between $8·10^{13}$ $cm^{-3}$ and $2·10^{14}$ $cm^{-3}$, for example, $1·10^{14}$ $cm^{-3}$, and is thus quasi-intrinsic.

Then, not illustrated, cleaning is carried out, and alignment marks are formed. To this end, a sacrificial oxide layer is thermally grown, portions of the sacrificial layer and of the first epitaxial layer 6 are selectively etched to form zero-layer marks, and the sacrificial oxide layer is removed in a per se known manner.

Figure 3:
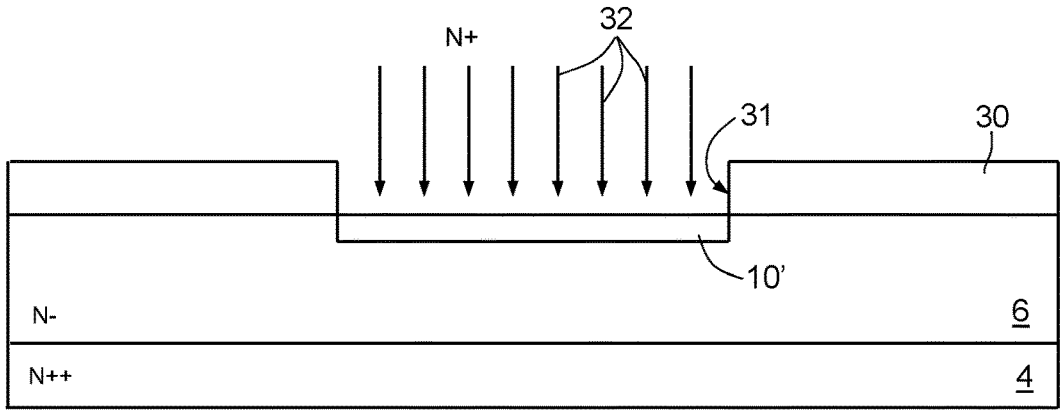

Next, FIG. 3, a hard mask 30 is formed, for example of TEOS oxide with a thickness of 0.8 μm. The hard mask 30, obtained in a known way by depositing and patterning a TEOS layer using a resist mask (not illustrated), has a window 31 where the buried region 10 is to be formed. Then, the buried region 10 is implanted; in particular, a double implantation is carried out, for example with phosphorus ions, first at an energy of 300 keV and with a dose of $1·10^{13}$ $cm^{-2}$, then at an energy of 350 keV and with a dose of $1·10^{14}$ $cm^{-2}$, as represented schematically in FIG. 3 by arrows 32. Both implantations are performed at a temperature of 500° C. A thin layer 10' is thus formed underneath the window 31. Alternatively, the double implantation may be carried out through a thin sacrificial oxide layer (not illustrated), with a thickness of, for example, 30 nm, and in this case the first implantation may be carried out at an energy of 450 keV, and the second implantation may be carried out at an energy 500 keV. In this case, after the double implantation, the thin sacrificial oxide layer is removed.

Figure 4:
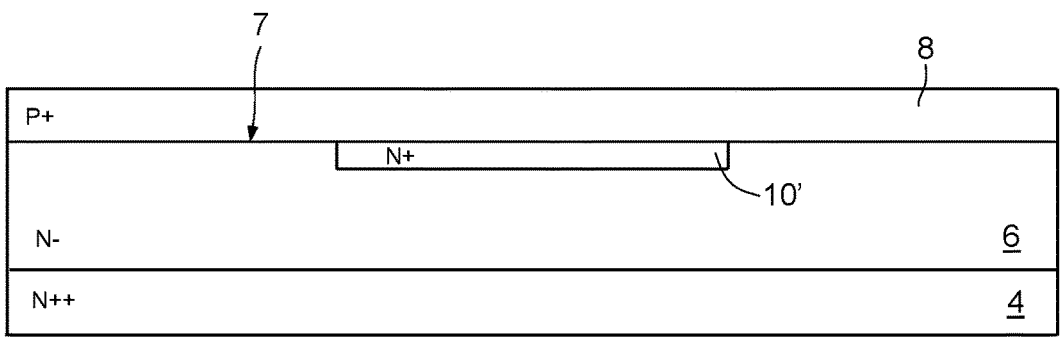

Then, FIG. 4, the hard mask 30 is removed, and the second epitaxial layer 8 is thermally grown. For instance, 4H-polytype silicon carbide (4H—SiC) is grown in two steps, by chemical vapor deposition (CVD) in an epitaxial reactor. In particular, the first step is carried out at a temperature to activate the phosphorus ions in the thin layer 10', for example at 1650° C. for 30 min in an argon environment to form the buried region 10. In this way, after the second epitaxial growth (described hereinafter), the buried region 10 has a variable profile, as mentioned above, with dopant concentration peak placed at a distance of 0.2-0.7 μm, for example at 0.4 μm, from the interface 7 (which is still to be formed). The second step, of proper epitaxial growth, is carried out at a temperature higher than 1500° C., for example at 1650° C., for 5 min using hydrogen as carrier and $HCl_3Si$ and $C_2H_4$ as silicon and carbon precursors. Then the second epitaxial layer 8 of P⁺ type is grown, for a thickness of 0.3-0.7 µm, for example of 0.5 µm, and with a doping dose between $1 \cdot 10^{19}$ cm$^{-3}$ and $1 \cdot 10^{20}$ cm$^{-3}$, for example $5 \cdot 10^{19}$ cm$^{-3}$, to obtain the body 3.

Figure 5:
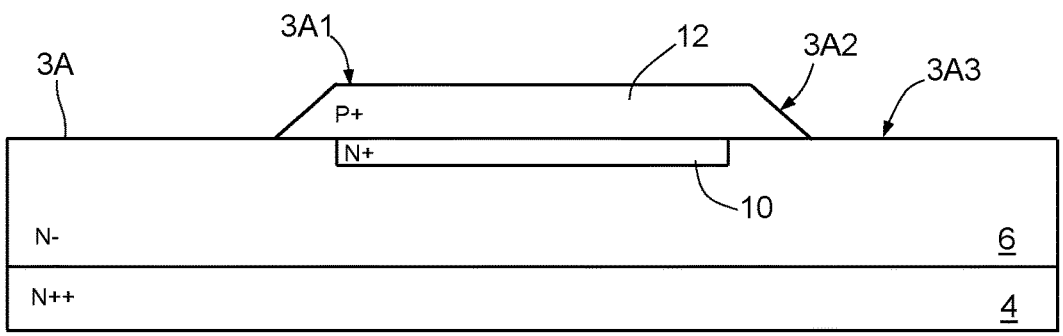

Next, FIG. 5, a TEOS dielectric layer (not illustrated), is deposited, for example, by plasma-enhanced CVD (PECVD), and the dielectric layer (not illustrated) is selectively etched to form a hard mask for the subsequent etching of the body 3. Then, portions of the second epitaxial layer 8 are selectively etched and removed, throughout the thickness of the layer, to define the anode region 12, and surface portions of the first epitaxial layer 6 are also selectively etched and removed. For instance, a dry etch is carried out to obtain the structure of FIG. 5. In this step, the shape of the top surface 3A of the body 3 is defined, with the portions 3A1-3A3.

Figure 6:
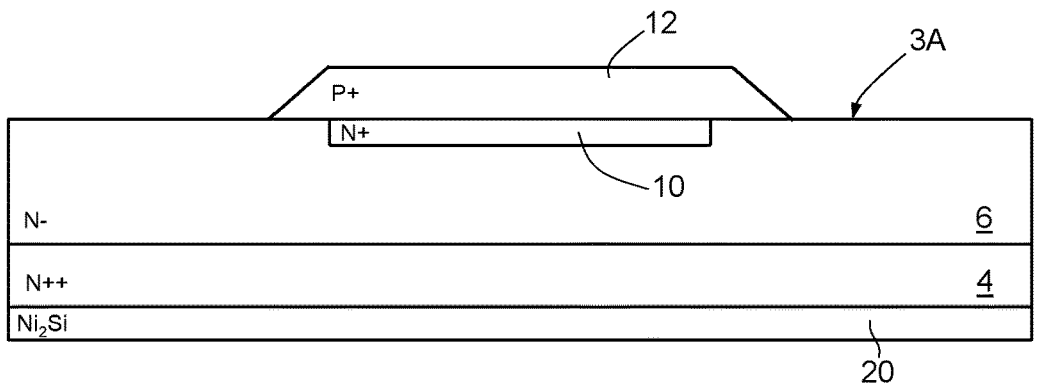

Next, FIG. 6, the top surface 3A of the body 3 is protected by a protective layer (not illustrated), and the bottom conductive region 20 is formed, for example by back nickel sputtering, with a thickness of 200 nm. After removing the protective layer (not illustrated), rapid thermal annealing (RTA) is carried out, for example at 1000° C., for 60 s, in a nitrogen environment.

Figure 7:
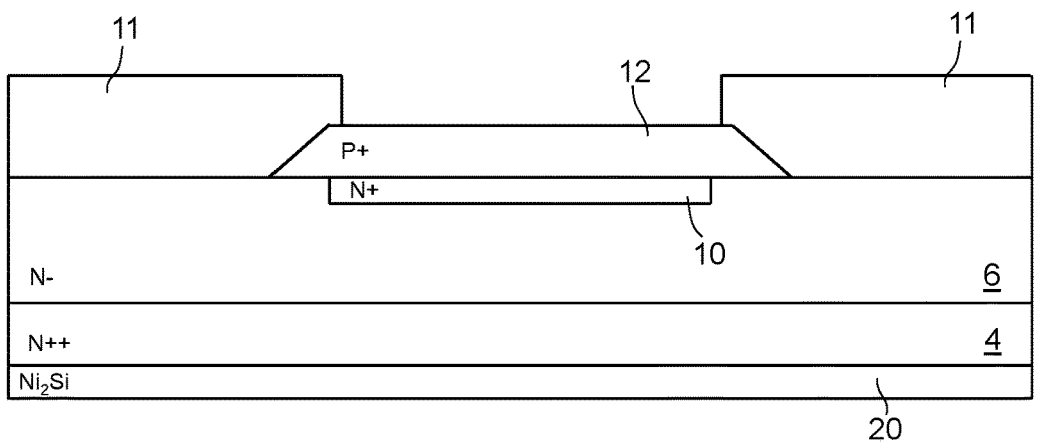

Then, FIG. 7, a field-oxide layer is deposited, intended to form the edge region 11. For instance, TEOS is deposited by CVD, with a thickness of 1-3 µm, for example 2 µm, and a wet etch of the field-oxide layer is carried out to remove it on the anode region 12 and form the edge region 11.

Figure 8:
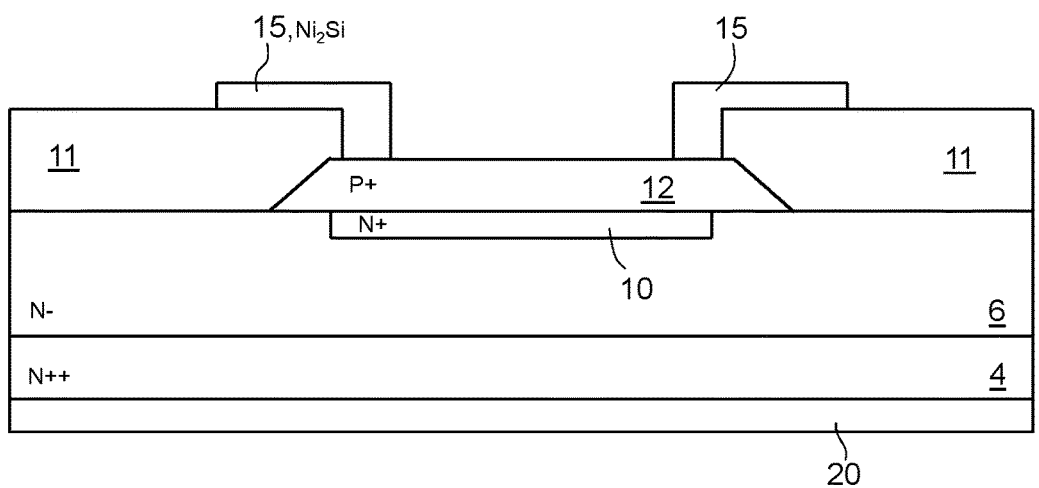

Thereafter, FIG. 8, the bottom conductive region 20 is protected, for example using a resist layer (not illustrated), and a conductive material layer, intended to form the top conductive region 15, is deposited. For instance, a nickel layer is deposited, via sputtering, for a thickness of 100 nm. The conductive material layer is then defined, for example by masked wet etching, and, after removing the mask, a rapid thermal annealing (RTA) is carried out, for example at 750° C. for 60 s, in a nitrogen environment, to form the top conductive region 15.

Finally, the front and rear electrodes are formed, to obtain the structure of FIG. 1. For instance, a metallic multilayer, comprising titanium (with a thickness of 80 nm) and an alloy of aluminum, silicon, and copper (AlSiCu, with a thickness of 3 µm) is deposited on the front surface, by sputtering. Then, the multilayer is patterned by wet etching to form the front contact 35, which extends over and in direct contact with the top conductive region 15. Next, the passivation layer 18, for example of silicon nitride with a thickness of 200 nm, is deposited on the front side and is selectively removed, for example by dry etching, so as to free the central area of the anode region 12 and the front contact 35.

Before or after forming the front contact 35, the bottom metallization 21 is formed. To this end, on the bottom conductive region 20 a metallic multilayer, for example, formed by a titanium layer with a thickness of 0.1 µm, a nickel layer, with a thickness of 0.4 µm, and a layer of gold, with a thickness of 0.05 µm, is deposited by sputtering.

In the photodetector 1, the buried region 10 represents an enriched region within the first epitaxial layer 6, which, as mentioned, is practically intrinsic, and thus provides a better confinement of the electrical field in the active area 14 of the photodetector 1.

The presence of the edge region 11 enables further confinement of the electrical field and increase of the breakdown voltage of the edge area 11, without affecting the breakdown of the central area of the photodetector 1 (active area 14). In fact, when, due to a biasing of the photodetector 1 at a higher voltage than breakdown voltage and generation of a photogenerated primary charge carrier an avalanche current is activated, it is desired that the avalanche current is confined in the central area of the photodetector 1, i.e., that breakdown does not affect the peripheral area. The presence of the edge region 11 thus enables setting of the breakdown voltage of the photodetector 1 at an appropriate value (for example, 80-90 V), optimized with respect to the desired detection behavior, preventing breakdown in the peripheral area. In particular, an inclination of the peripheral surface 11' of the edge region 11 higher than 45° enables a particularly effective confinement to be obtained.

With the described process, and in particular by forming the second epitaxial layer 8 by thermal growth, with annealing and activating the dopants in the buried region 10, it is possible to obtain a defectiveness reduction in the active area 14 of the photodetector 1, and thus an effective dark current reduction.

Thereby, the photodetector has a very low dark current, a high fill factor, and a very low breakdown voltage in the central active area. The photodetector 1 can thus be conveniently used in high-density photodetector arrays.

Even though, as mentioned, the structure of FIG. 1 operates in a reliable way to maintain the avalanche multiplication in the active area of the photodetector 1 at a voltage of approximately 80 V, when the photodetector has to work at breakdown voltages of between 80 V and 120 V, it is possible to integrate concentric edge rings surrounding the active area 14.

FIG. 9 thus shows a photodetector 100 identical to the photodetector 1 of FIG. 1, except for the shape of the edge region, here designated by 111, so that same elements are designated by the same numbers.

In detail, the edge region 111 forms a series of edge rings 140 projecting towards the inside of the body 3. The edge rings 140, coaxial to each other, to the anode region 12, and to the buried region 10, extend throughout the thickness of the second epitaxial layer, here designated by 108, as far as into the surface portion of the first epitaxial layer 6.

The edge rings 140, in the illustrated example two, are formed by appropriately patterning the hard mask used while etching the second epitaxial layer 108 (while performing the etching referred to above with reference to FIG. 5 for the photodetector 1 of FIG. 1). In practice, in this step, in the body 103, annular etchings or depressions are obtained, complementary shaped to the edge rings 140, by removing selective portions of the second epitaxial layer 108 and underlying surface portions of the first epitaxial layer 6.

The edge rings 140 have a quadrangular shape, here trapezoidal, with minor base facing downwards. In this case, the edge rings have lateral walls 140C inclined by at least 45° with respect to the central axis A (and to the plane XY). Preferably, the inclination is higher than 45°, up to almost 90° (compatibly with the technology), and in this case the edge rings have a quasi-rectangular shape. The edge rings 140 may moreover have a minor base, on their underside 140A (the side parallel to axis X in FIG. 9, in contact with the first epitaxial layer 6), with a width of at least 0.2 µm, and may be spaced at a distance (periphery portion 140B parallel to axis X in FIG. 9 and in contact with the second epitaxial layer 108) of at least 0.2 µm. Preferably, the width of the minor base 140A is 0.8 µm and the periphery portion 140B is 2 µm. However, the edge rings 140 may be arranged with constant or variable spacing; in the latter case, the periphery portion 140B between adjacent edge rings 140 is different.

The edge rings 140 have the function of increasing the breakdown voltage of the edge area, which depends upon the geometry and surface electrical charge in the dielectric layer that forms the edge region 111, thus ensuring that avalanche breakdown of the photodetector occurs in the active area 14 of the photodetector 100, where the buried region 10 is present.

The edge region 111 comprises at least two edge rings; however, simulations made by the present applicant have illustrated that the number of rings, their width, and their spacing are not critical. In particular, it has been shown that the illustrated structure, with two edge rings 140, represents an optimal compromise between the electrical characteristics and the performance of the photodetector 100 and its dimensions.

FIG. 10 shows a different embodiment, wherein the photodetector 200 has a field distribution structure, so called field plate. In detail, in FIG. 10, where parts in common with FIG. 1 are designated by the same reference numbers, the photodetector 200 has an edge region 211 patterned so as to have an inner annular portion 211A, extending over the periphery of the anode region 12; a annular portion 211B, arranged externally and as a continuation of the inner annular portion 211A, adjacent to the peripheral surface 12A of the anode region 12; an annular portion 211D with variable thickness, arranged externally and as a continuation of the sloped annular portion 211B and having an increasing thickness from the latter; and an outer portion 211C, of constant thickness, equal to the outer portion 11C of the edge region 11 of the photodetector 1 of FIG. 1 (for example, 2 μm).

For instance, the sloped annular portion 211B may be arranged at an angle of approximately 30° with respect to a horizontal plane parallel to the rear surface 3B of the body 3 (plane XY of the Cartesian reference system XYZ), and the top surface of the annular portion 211D with variable thickness may be arranged at an angle of approximately 7° with respect to the same horizontal plane parallel to the rear surface 3B of the body 3.

In this way, the sloped annular portion 211B and the variable thickness annular portion 211D delimit a recessed area 241 having an annular shape. The top conductive region 215 here has an ohmic-contact portion 215A, extending over the peripheral surface of the anode region 12 and similar to the conductive region 15 of FIG. 1, and a field-plate portion 215B, arranged as a continuation of, and peripherally with respect to, the ohmic-contact portion 215A and extending over the recessed area 241.

The edge region 211 may be formed using an appropriate photolithographic process, including masking resist reflow.

The field-plate portion 215B, of metal such as nickel silicide, thus forms an electrical field redistribution layer causing the structure of the photodetector 200 to be even stronger to edge breakdown. In particular, as evident to the person skilled in the art, the inclination of the sloped annular portion 211B and of the variable thickness annular portion 211D, as well as the length of the field-plate portion 215B, may be calibrated based on the variability of the manufacturing process steps which are used to define the photodetector 200.

Figure 11:
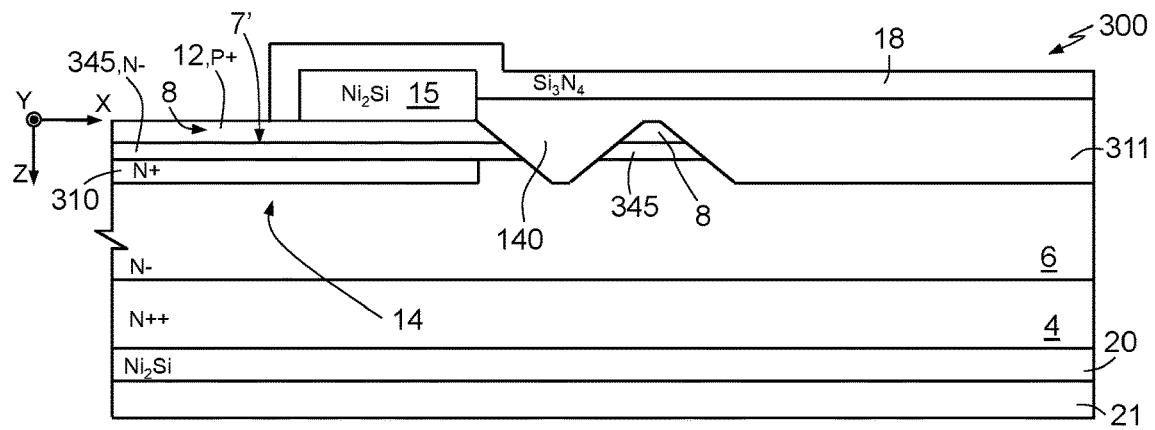

FIG. 11 shows a different embodiment of the present photodetector wherein the buried region no longer faces the interface 7 between the first and second epitaxial layers 6, 8, but is arranged at a distance from this interface.

In detail, FIG. 11 shows a photodetector 300 comprising, in addition to the first and second epitaxial layers 6, 8, an epitaxial buffer layer 345, extending between the first and second epitaxial layers 6, 8 and overlying the buried region 310. The epitaxial buffer layer 345 thus forms an interface 7' with the second epitaxial layer 8, is of an N type, and has an intermediate doping level between the first epitaxial layer 6 and the buried region 310. The epitaxial buffer layer 345 moreover has a thickness of 0.2-0.4 μm. In addition, in this case, the depth of the buried region 310 where a peak concentration occurs is between 0.3 and 0.7 μm, for example at approximately 0.4 μm from the interface 7'.

The photodetector 300 of FIG. 11 has an edge region 311 with an edge ring 140; however, it may not have edge rings 140 and be shaped as in FIG. 1, or have a number of edge rings 140, as in FIG. 9.

Figure 12:
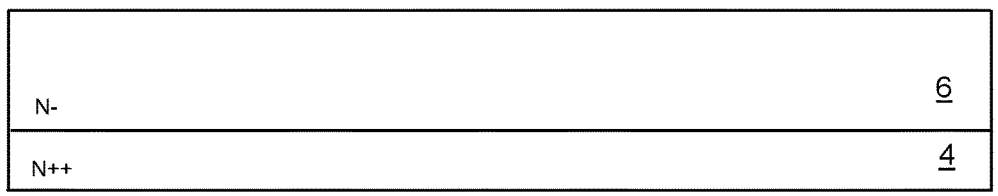
FIGS. 12-14 are schematic cross-sections of the photodetector of FIG. 11 during successive manufacturing steps.
Figure 13:
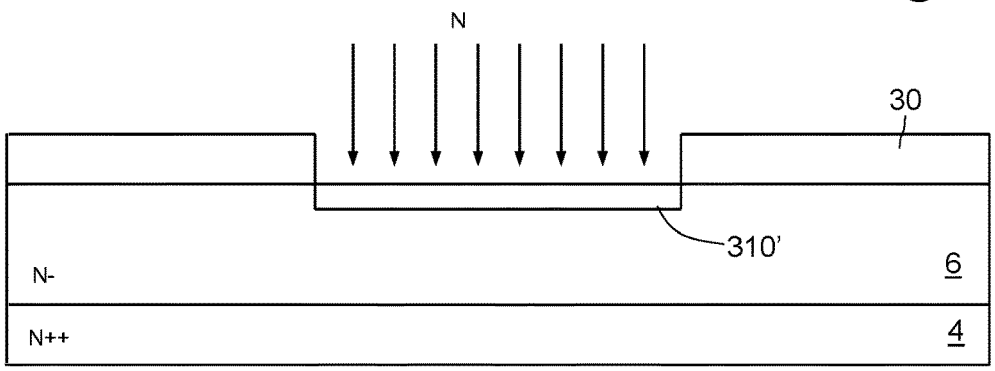
Figure 14:
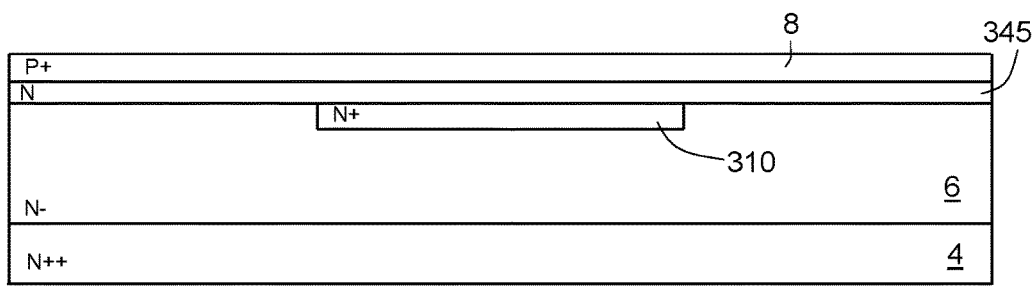

The photodetector 300 of FIG. 11 may be manufactured as illustrated in FIGS. 12-14.

In detail, as shown in FIG. 12 and as described with reference to FIG. 2, the first epitaxial layer 4 is epitaxially grown on the substrate 4, for example 4H-polytype silicon carbide (4H—SiC) of an N type with a thickness of, for example, 350 μm and a doping level of, for example, $1 \cdot 10^{19}$ cm$^{-3}$. The first epitaxial layer 4 is doped with nitrogen ions, and has a thickness of approximately 9.5 μm and a doping level of, for example, $1 \cdot 10^{14}$ cm$^{-3}$.

After cleaning and forming alignment marks, as described above, selective surface implantation is carried out, at a low energy, of dopant ions of an N type, for example phosphorus, using the hard mask 30, FIG. 13. For instance, implantation may be carried out at an energy of 80 keV and with a dose of $1 \cdot 10^{14}$ cm$^{-2}$, to form the thin layer 310', which has a peak concentration at approximately 0.1 μm from the surface of the first epitaxial layer 6.

After removing the hard mask 30, FIG. 14, thermal annealing and a three-step epitaxial growth using a CVD process are carried out in an epitaxial reactor. In detail, first phosphorus ions of the thin layer 310' are activated at a temperature of, for example, 1650° C. for 30 s in argon; then, the epitaxial buffer layer 345 is grown at a temperature of 1650° C. for 30 min using hydrogen as gas carrier and HCl$_3$Si and C$_2$H$_4$ as silicon and carbon precursors, with doping nitrogen N. The epitaxial buffer layer 345 of a 4H—SiC type with a doping level of $1 \cdot 10^{16}$ cm$^{-3}$ and a thickness of 0.2-0.4 μm is thus obtained, as mentioned above. Then, a further epitaxial growth is carried out at 1650° C. for 3 min using hydrogen as carrier and HCl$_3$Si and C$_2$H$_4$ as silicon and carbon precursors, with doping aluminum Al. The second epitaxial layer 8 of a P$^+$ type is thus obtained for a thickness of, for example, 0.2 μm and with a doping dose comprised between $1 \cdot 10^{19}$ cm$^{-3}$ and $1 \cdot 10^{20}$ cm$^{-3}$, for example, $5 \cdot 10^{19}$ cm$^{-3}$.

The process proceeds with the steps already described with reference to FIGS. 5-8, until the final structure of FIG. 11.

In this embodiment, the low-energy implantation of the buried layer 310, followed by the double epitaxial growth (first of an N type and then of a P type) reduces damage in the active area 14. Moreover, the electrical field is almost completely confined in the buffer layer 345 and within the active area 14, thus reducing the risk of breakdown in the peripheral area.

According to a different manufacturing process, the buried region may be arranged at a distance from the second epitaxial layer 8 and embedded within the first epitaxial layer 6, using a high-energy buried implantation, as described with reference to FIGS. 15-17.

Figure 15:
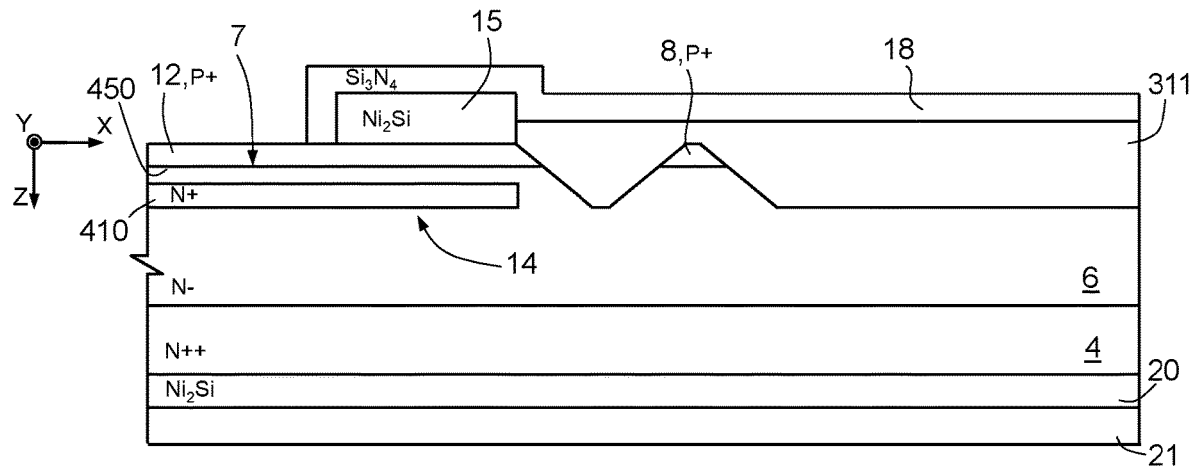
FIG. 15 is a cross-section of yet another embodiment of the present photodetector.

In detail, FIG. 15 shows a photodetector 400 wherein the first and second epitaxial layers 6, 8 are adjacent and contiguous to each other and form the interface 7, as in FIG. 1. The buried region, here designated by 410, extends at a short distance from the interface 7 so that the maximum concentration area is arranged, also in this case, approximately at a distance of 0.2-0.7 μm from the interface 7. In practice, an extremely thin buffer portion (designated by 450) of the first epitaxial layer 6 is arranged between the buried region 410 and the interface 7 and operates similarly to the buffer region 345 of FIG. 11.

Figure 16:
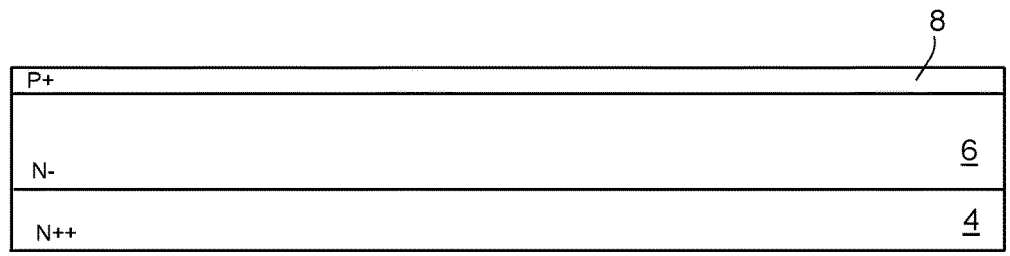
FIGS. 16 and 17 are schematic cross-sections of the photodetector of FIG. 15 during successive manufacturing steps.
Figure 17:
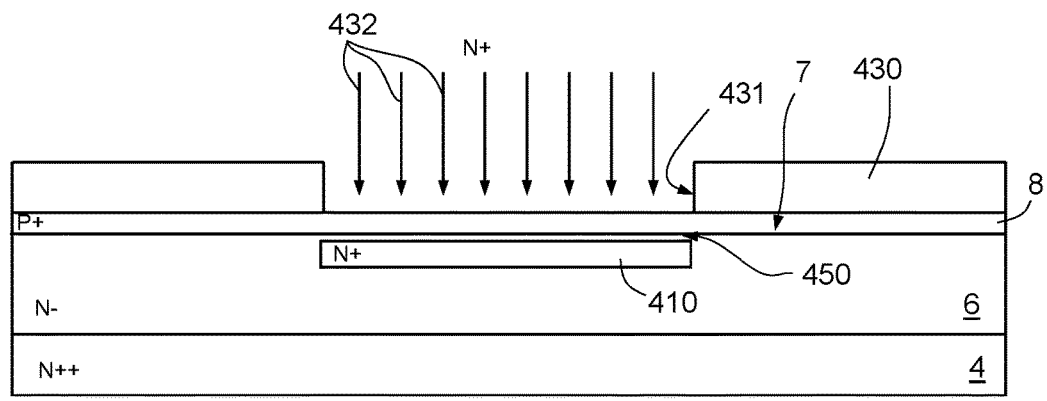

The photodetector 400 may be manufactured as illustrated in FIGS. 16 and 17.

In detail, FIG. 16, initially the first epitaxial layer 6 is grown on the substrate 4 as described with reference to FIG. 2. The thickness, material, and doping level of the substrate 4 and of the first epitaxial layer 6 may be the same as those described with reference to FIG. 2. Then, a P$^+$ type epitaxial growth is carried out on the first epitaxial layer 6, for a thickness of less than 0.2 μm, for example, 0.1 μm, and with a doping dose of, for example, $5 \cdot 10^{19}$ cm$^{-3}$. Boron may be used as dopant ion species. The structure of FIG. 16 is thus obtained.

Next, in a not illustrated way, cleaning is carried out, and the alignment marks are formed, as described above for the embodiment of FIGS. 2-8.

Then, FIG. 17, a hard mask 430 is formed, for example of TEOS oxide with a thickness of 0.8 μm. The hard mask 430, obtained in a known way by depositing a TEOS layer, for example by PECVD, and patterning using a resist mask (not illustrated), has a window 431 where it is desired to form the buried region 410. The buried region 410 is implanted using the mask 430, for example with phosphorus ions, with an energy to depth confine the dopant atoms, at a distance from the top surface of the first epitaxial layer 6. For instance, a double implantation is carried out, first at an energy of 420 keV with a dose of $1 \cdot 10^{13}$ cm$^{-2}$, then at an energy of 490 keV with a dose of $1 \cdot 10^{14}$ cm$^{-2}$, both at a temperature of 500° C., as represented schematically in FIG. 17 by the arrows 432. The buried region 410 is thus formed underneath the window 431.

Then the steps already described with reference to 5-8 follow, until the final structure of FIG. 15.

Possibly, as clear to the person skilled in the art, additional annealings may be carried out to reduce the defectiveness caused by the high-energy implantation of the buried region 410 in the active area 14.

With the solution of FIGS. 15 to 17, a thin buffer layer 450, of a quasi-intrinsic N type is formed between the buried region 410 and the anode region 12 and contributes to confining the electrical field, albeit maintaining the breakdown voltage below 100 V with reverse biasing.

According to another alternative, the deep implantation of the buried region 410 is performed before carrying out the second epitaxial growth of a P$^+$ type to form the second epitaxial layer.

FIG. 18 shows an array 500 of photodetectors 1, 100, 200, 300, 400, integrated in a single die 2. The array 500 may comprise any number of same photodetectors 1, 100, 200, 300, 400. In use, the photodetectors 1, 100, 200, 300, 400 of the array 500 are arranged facing an external light source 560 adapted to emit ultraviolet radiation.

Figure 19:
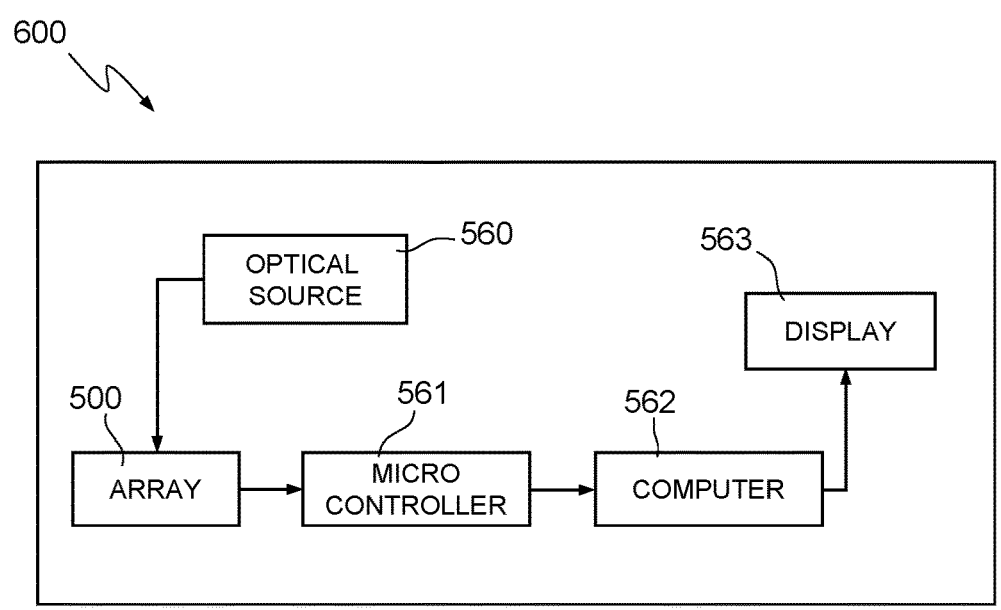
FIG. 19 shows a block diagram of a system including an array of photodetectors, of the type illustrated in FIG. 18.

The array 500 of photodetectors 1, 100, 200, 300, 400 may be used, as illustrated in FIG. 19, in a generic system 600, wherein the array 500 is coupled to a microcontroller 561, in turn coupled to a computer 562 controlling a display 563. The microcontroller 561 processes the output signal of the array 500 and supplies a processed signal to the computer 562; this may thus analyze the processed signal and display the associated information on the display 563.

Finally, it is clear that modifications and variations may be made to the photodetector and to the manufacturing process thereof, described and illustrated herein, without thereby departing from the scope of the present disclosure. For instance, the various embodiments described can be combined to provide further solutions.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a semiconductor ultraviolet light photodetector, the process comprising:
   epitaxially growing a first epitaxial layer of silicon carbide having a first conductivity type and a first doping level;
   implanting a buried region, having the first conductivity type and a second doping level, higher than the first doping level, within the first epitaxial layer, a portion of the first epitaxial layer underneath the buried region forming a cathode region;
   epitaxially growing a second epitaxial layer of silicon carbide having a second conductivity type, on the first epitaxial layer, the second epitaxial layer having a thickness, the first and second epitaxial layers defining a silicon carbide body;
   selectively removing portions of the second epitaxial layer and underlying surface portions of the first epitaxial layer, thus defining an anode region in the second epitaxial layer and forming a body surface including a projecting portion overlying the anode region, a sloped lateral portion, laterally delimiting the anode region and spaced from the buried region, and an edge portion on a peripheral portion of the first epitaxial layer,
   the selectively removing of the portions of the second epitaxial layer and the underlying surface portions of the first epitaxial layer including forming a plurality of concentric depressions external to the anode region, each of the plurality of concentric depressions including a base and inclined sidewalls, the plurality of concentric depressions being spaced from each other by portions of the first and second epitaxial layers; and
   forming an edge region of dielectric material in contact with the sloped lateral portion and the edge portion of the body surface, the forming of the edge region including completely filling the plurality of concentric depressions with the dielectric material.

2. The process according to claim 1, wherein epitaxially growing the second epitaxial layer includes carrying out annealing for reducing defectiveness at a temperature of at least 1500° C.

3. The process according to claim 1, wherein the plurality of concentric depressions are in the edge portion.

4. The process according to claim 1, further comprising:
   forming a buffer layer between the buried region and the anode region.

5. The process according to claim 4, wherein forming the buffer layer includes, after implanting the buried region and before epitaxially growing the second epitaxial layer, epitaxially growing the buffer layer, the buffer layer having a third doping level, higher than the first doping level and lower than the second doping level.

6. The process according to claim 4, wherein implanting the buried region includes implanting dopant ions with an energy to form the buried region spaced from a top surface of the first epitaxial layer to form the buffer layer between the buried region and the top surface of the first epitaxial layer.

7. The process according to claim 6, wherein implanting the buried region is carried out after epitaxially growing the second epitaxial layer and before selectively removing the portions of the second epitaxial layer and the underlying surface portions of the first epitaxial layer.

8. A method, comprising:
forming a first layer of silicon carbide on a substrate, the first layer having a first conductivity type and a first doping level;
forming a buried region in the first layer, the buried region having the first conductivity type and a second doping level higher than the first doping level, the buried region extending into the first layer to a first depth;
forming a second layer of silicon carbide on the first layer, the second layer having a second conductivity type, the buried region being positioned between the first layer and the second layer;
forming a plurality of concentric depressions through the second layer and into the first layer, each of the plurality of concentric depressions including a base and inclined sidewalls, the plurality of concentric depressions being spaced from each other by portions of the first and second layers, the plurality of concentric depressions extending into the first layer to a second depth smaller than the first depth;
forming a layer of dielectric material on the first layer, in the plurality of concentric depressions, and a portion of the second layer; and
forming a continuous conductive layer on the second layer and the layer of dielectric material, a first portion of the continuous conductive layer extending on the second layer and directly over the buried region, and a second portion of the continuous conductive layer extending on the layer of dielectric material and directly over the base of a concentric depression of the plurality of concentric depressions.

9. The method of claim 8 wherein the buried region is spaced from the plurality of concentric depressions by a portion of the first layer that directly underlies the second layer.

10. The method of claim 8 wherein the first layer forms a cathode region, and the second layer forms an anode region.

11. A method, comprising:
forming a cathode region including a first layer of silicon carbide on a substrate, the first layer having a first conductivity type and a first doping level;
forming a buried region in the first layer, the buried region having the first conductivity type and a second doping level higher than the first doping level, the buried region extending into the first layer to a first depth;
forming an anode region including a second layer of silicon carbide on the first layer, the second layer having a second conductivity type, the buried region being positioned between the first layer and the second layer, the second layer including first and second sloped lateral portions that extend past first and second edges, respectively, of the buried region;
forming a plurality of concentric depressions through the second layer and into the first layer, each of the plurality of concentric depressions including a base and inclined sidewalls, the plurality of concentric depressions being spaced from each other by portions of the first and second layers, the plurality of concentric depressions extending into the first layer to a second depth smaller than the first depth; and
forming a layer of dielectric material on the first layer, in the plurality of concentric depressions, and a portion of the second layer.

12. The method of claim 11 wherein
the first layer includes third and fourth sloped lateral portions that are aligned with the first and second sloped lateral portions, respectively,
the buried region is spaced apart from the third and fourth sloped lateral portions by respective portions of the first layer that directly underlie the second layer.

13. The method of claim 11, further comprising:
forming a conductive layer on the second layer, the conductive layer directly overlying the buried region.

14. The method of claim 11 wherein
forming the cathode region includes epitaxially growing the first layer,
forming the buried region includes implanting the buried region in the first layer, and
forming the anode region includes epitaxially growing the second layer.

* * * * *